(12) United States Patent
Chen

(10) Patent No.: US 10,964,662 B2
(45) Date of Patent: Mar. 30, 2021

(54) METHOD OF TRANSFERRING MICRO DEVICE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

(*) Notice: Subject to any disclaimer, the term of this patent is extended or adjusted under 35 U.S.C. 154(b) by 0 days.

(21) Appl. No.: 16/507,061

(22) Filed: Jul. 10, 2019

(65) Prior Publication Data

US 2021/0013172 A1    Jan. 14, 2021

(51) Int. Cl.
| | |
|---|---|
| *H01L 23/00* | (2006.01) |
| *H01L 21/683* | (2006.01) |
| *H01L 33/62* | (2010.01) |
| *H01L 25/075* | (2006.01) |

(52) U.S. Cl.
CPC .......... *H01L 24/80* (2013.01); *H01L 21/6835* (2013.01); *H01L 25/0753* (2013.01); *H01L 33/62* (2013.01); *H01L 2221/68363* (2013.01); *H01L 2224/80006* (2013.01); *H01L 2224/8012* (2013.01); *H01L 2224/80825* (2013.01); *H01L 2933/0066* (2013.01)

(58) Field of Classification Search
CPC . H01L 24/80; H01L 21/6835; H01L 25/0753; H01L 33/62; H01L 2221/68363; H01L 2224/80006; H01L 2224/80825; H01L 2933/0066; H01L 2224/8012

See application file for complete search history.

(56) References Cited

U.S. PATENT DOCUMENTS

| | | | | |
|---|---|---|---|---|
| 10,141,475 | B1 * | 11/2018 | Chen | H01L 33/0095 |
| 10,312,218 | B1 * | 6/2019 | Chen | H01L 33/62 |
| 10,593,853 | B1 * | 3/2020 | Chen | H01L 24/16 |
| 2004/0154733 | A1 * | 8/2004 | Morf | H01L 24/75 156/241 |
| 2015/0048523 | A1 * | 2/2015 | Suga | H01L 24/33 257/777 |
| 2017/0036342 | A1 * | 2/2017 | Chen | B25J 15/008 |
| 2017/0221856 | A1 * | 8/2017 | Yamauchi | H01L 21/187 |
| 2017/0373228 | A1 * | 12/2017 | Chang | H01L 33/44 |

* cited by examiner

*Primary Examiner* — Ahmed N Sefer
(74) *Attorney, Agent, or Firm* — CKC & Partners Co., LLC

(57) ABSTRACT

A method of transferring a micro device is provided. The method includes: aligning a transfer plate with the micro device thereon with a receiving substrate having a contact pad thereon such that the micro device is above or in contact with the contact pad; moving a combination of the transfer plate with the micro device thereon and the receiving substrate into a confined space with a relative humidity greater than or equal to about 85% so as to condense some water between the micro device and the contact pad; and attaching the micro device to the contact pad.

11 Claims, 12 Drawing Sheets

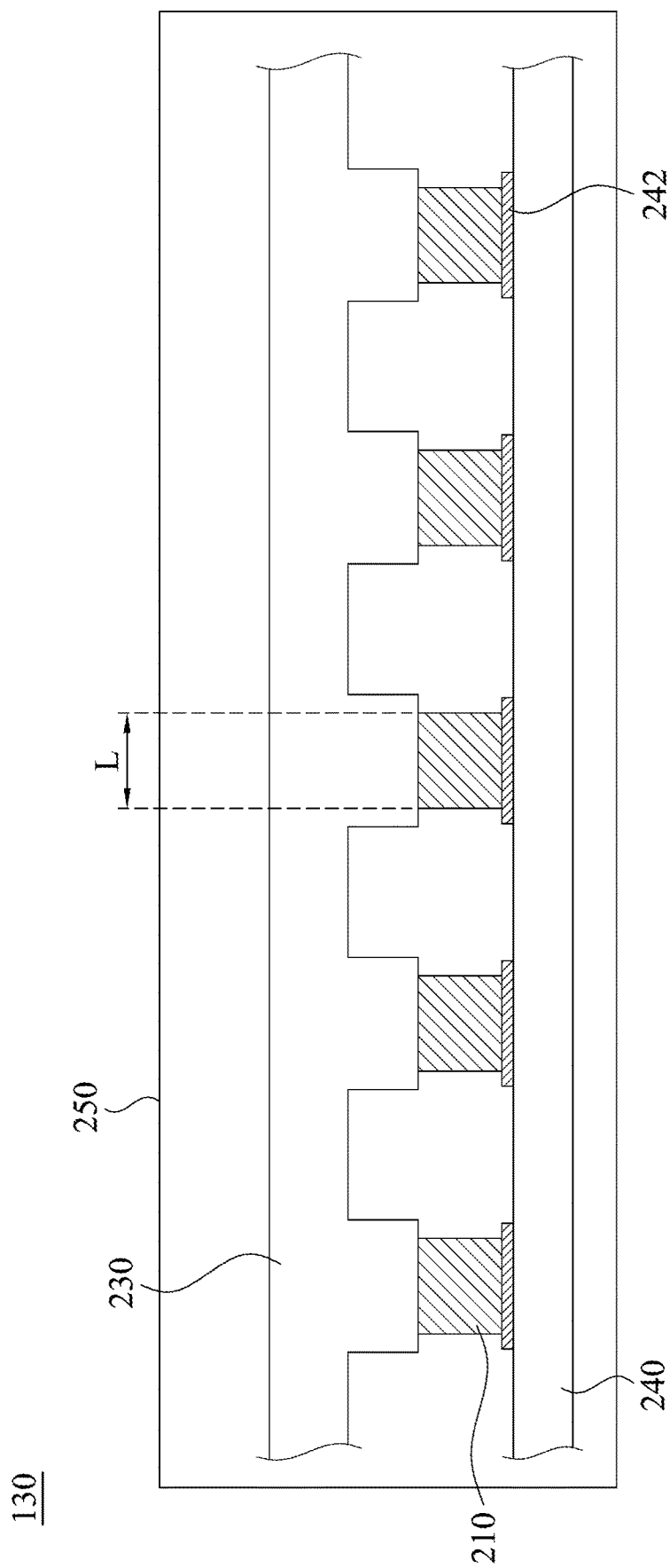

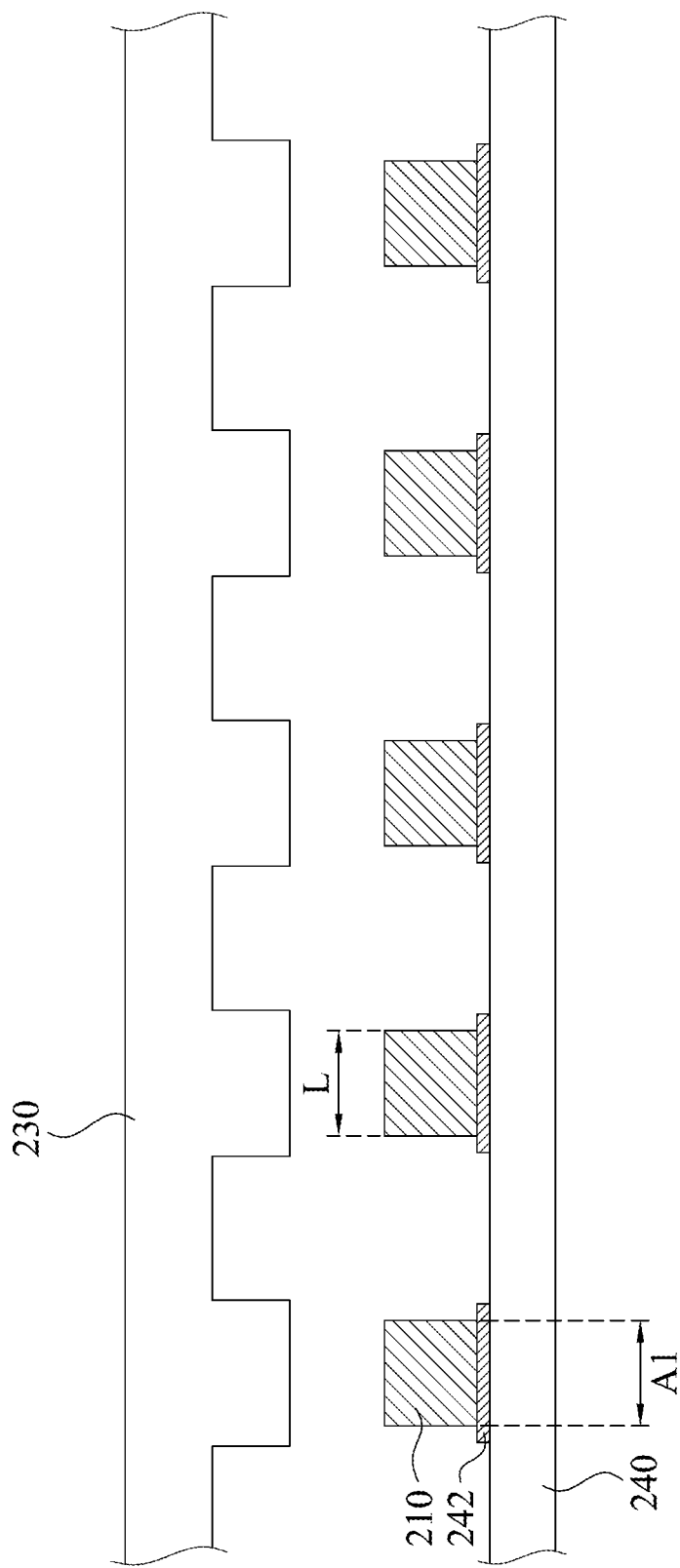

METHOD OF TRANSFERRING MICRO DEVICE

BACKGROUND

Field of Invention

The present disclosure relates to a method of transferring a micro device.

Description of Related Art

The statements in this section merely provide background information related to the present disclosure and do not necessarily constitute prior art.

Traditional technologies for transferring of devices include transferring from a transfer wafer to a receiving substrate by wafer bonding. One such implementation is "direct bonding" involving one bonding stage of an array of devices from a transfer wafer to a receiving substrate, followed by removal of the transfer wafer. Another such implementation is "indirect bonding" which involves two bonding/de-bonding stages. In indirect bonding, a transfer head may pick up an array of devices from a donor substrate, and then bond the array of devices to a receiving substrate, followed by removal of the transfer head.

In recent years, many researchers and experts try to overcome difficulties in making a massive transfer of devices (i.e., transferring millions or tens of millions of devices) possible for commercial applications. Among those difficulties, cost reduction, time efficiency, and yield are three of the important issues.

SUMMARY

According to some embodiments of the present disclosure, a method of transferring a micro device is provided. The method includes: aligning a transfer plate with the micro device thereon with a receiving substrate having a contact pad thereon such that the micro device is above or in contact with the contact pad; moving a combination of the transfer plate with the micro device thereon and the receiving substrate into a confined space with a relative humidity greater than or equal to about 85% so as to condense some water between the micro device and the contact pad; and attaching the micro device to the contact pad.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
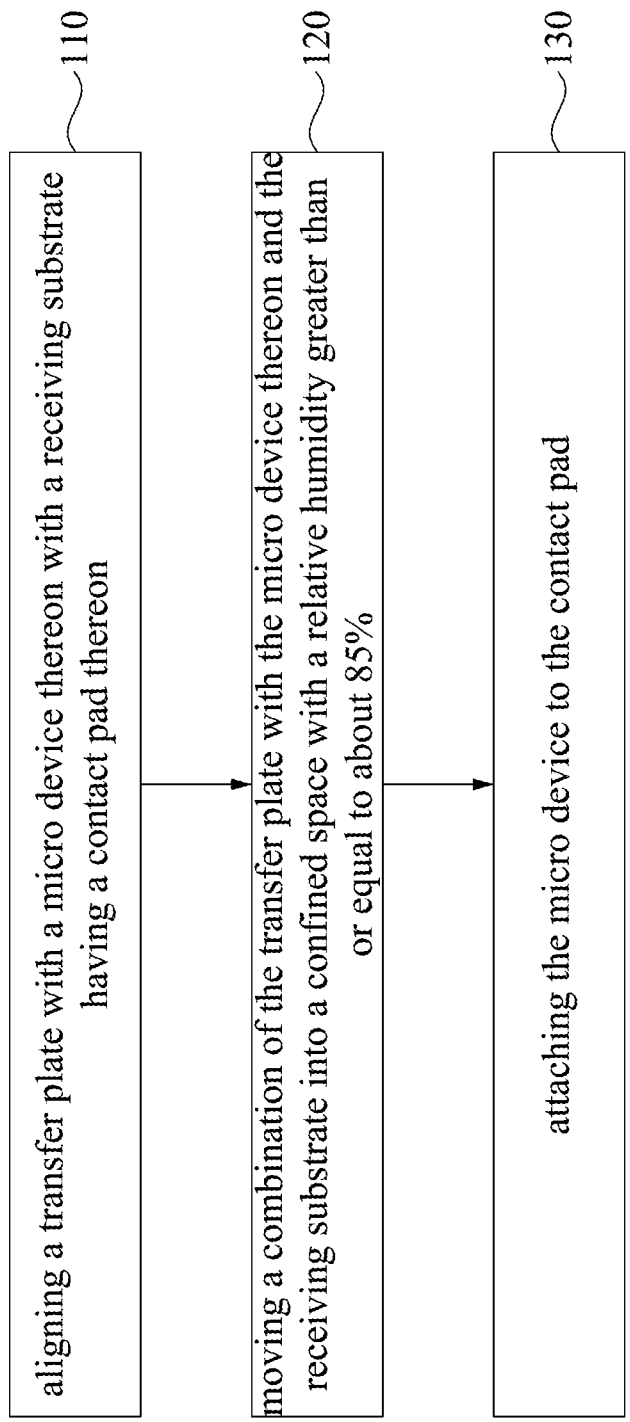
FIG. 1 is a flow chart of a method of transferring a micro device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2A:
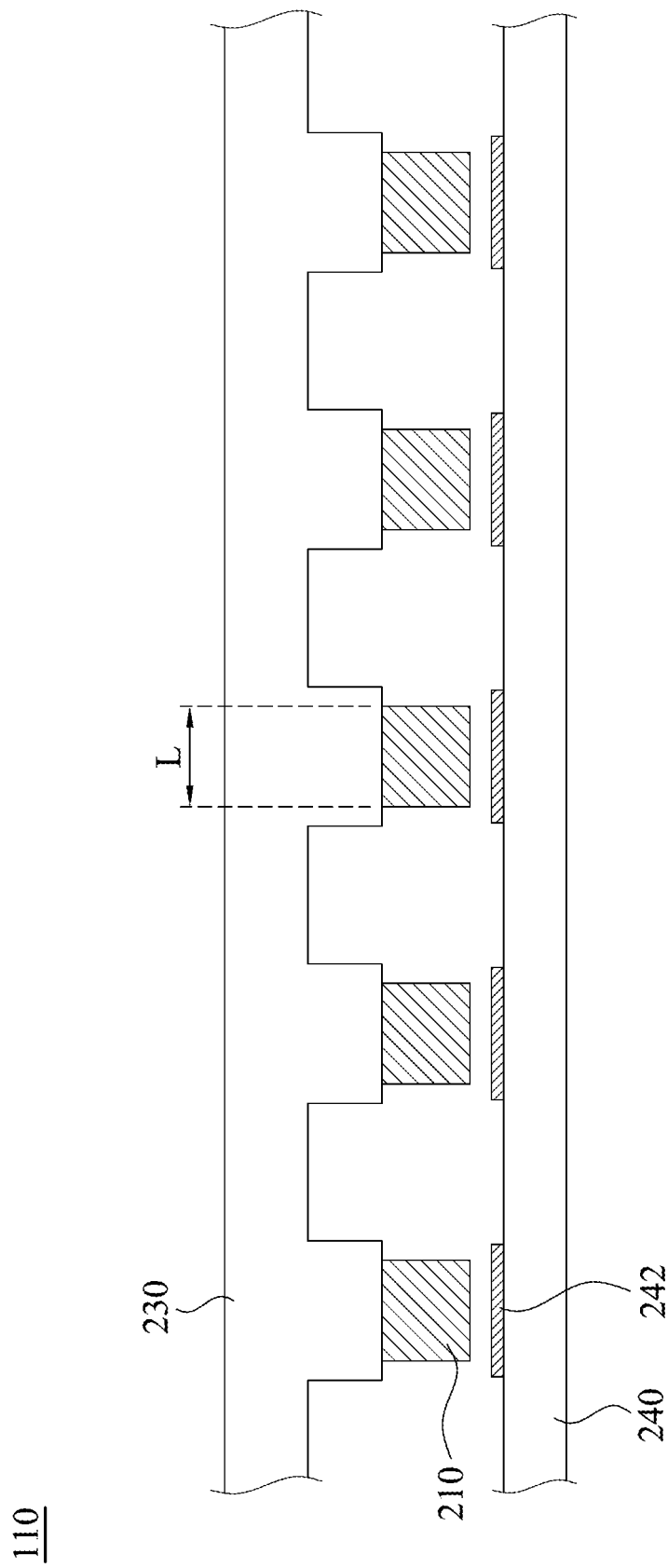
FIG. 2A is a schematic cross-sectional view of an intermediate stage of the method illustrated by FIG. 1 according to some embodiments of the present disclosure.
Figure 2A:
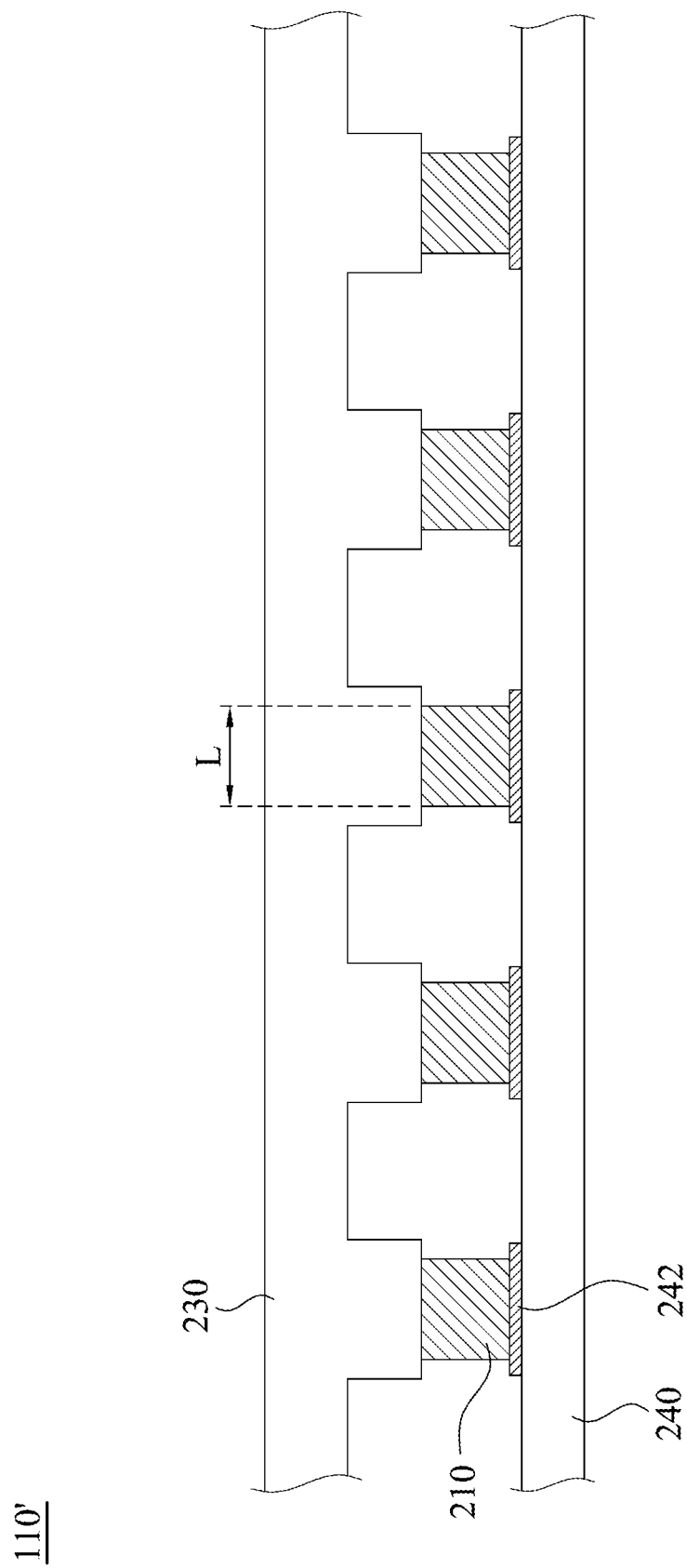
Figure 2B:
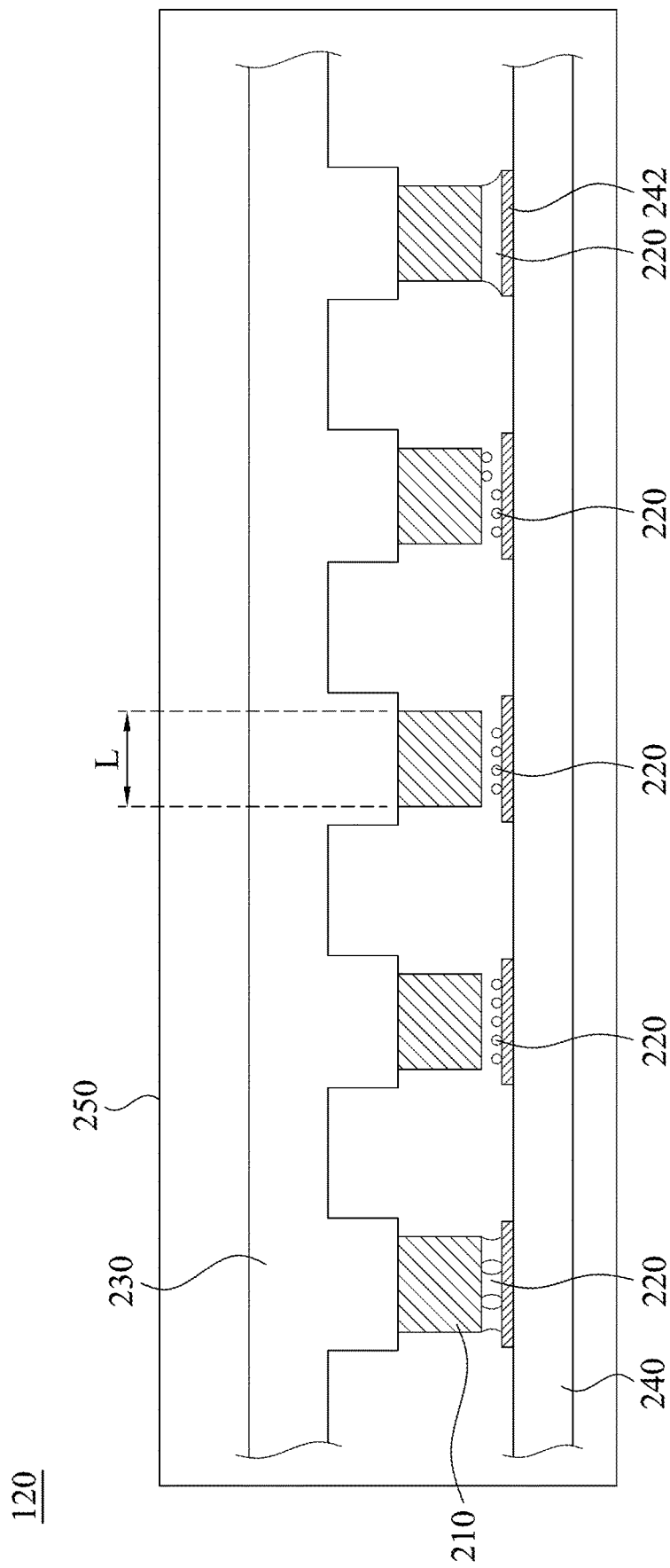
FIG. 2B is a schematic cross-sectional view of an intermediate stage of the method illustrated by FIG. 1 according to some embodiments of the present disclosure.
Figure 2C:
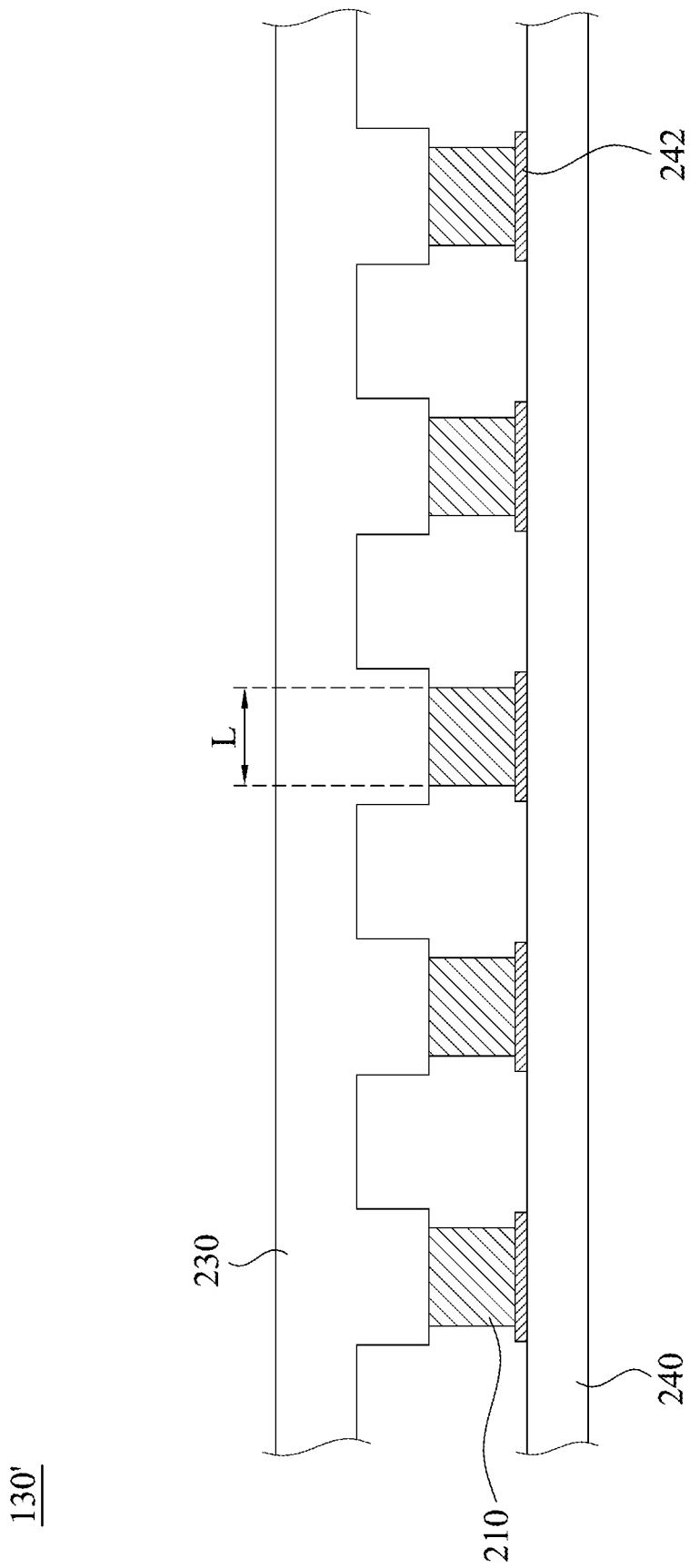
FIG. 2C is a schematic cross-sectional view of an intermediate stage of the method illustrated by FIG. 1 according to some embodiments of the present disclosure.

Reference is made to FIGS. 1 to 2C'. FIG. 1 is a flow chart of a method 100 of transferring a micro device 210 according to some embodiments of the present disclosure. FIGS. 2A, 2A', 2B, 2C, and 2C' are schematic cross-sectional views of intermediate stages of the method 100 illustrated by FIG. 1 according to some embodiments of the present disclosure. The method 100 begins with operation 110 (or 110' as shown in FIG. 2A') in which a transfer plate 230 with the micro device 210 thereon is aligned with a receiving substrate 240 having a contact pad 242 thereon such that the micro device 210 is above (as referred to FIG. 2A) or in contact with the contact pad 242 (as referred to FIG. 2A'). The method 100 continues with operation 120 in which a combination of the transfer plate 230 with the micro device 210 thereon and the receiving substrate 240 is moved into a confined space 250 (e.g., constructed by a chamber, but should not be limited thereto) with a relative humidity greater than or equal to about 85% so as to condense some water 220 between the micro device 210 and the contact pad 242 (as referred to FIG. 2B). The method 100 continues with operation 130 (or 130' as shown in FIG. 2C') in which the micro device 210 is attached to the contact pad (as referred to FIGS. 2C and 2C'). Since the humidity is locally controlled within the confined space 250, energy consumption can be reduced. Furthermore, the method 100 using the confined space 250 as mentioned can form the water 220 more uniform which is not influenced by temperature gradient since the water 220 is formed by the relative humidity which is high enough as compared to a case when lowering a temperature to form the water 220 is merely performed without the confined space 250. In some embodiments, the water 220 formed by the method 100 can maintain longer without being evaporated compared to a case when showering a vapor to form the water 220 is merely performed without the confined space 250. In some embodiments, the degrees of lowering the temperature within the confined space 250 can be smaller compared to that without the confined space 250. In some embodiments, lowering the temperature and/or showering the vapor can be omitted due to the relative humidity which is greater than or equal to about 85%. Said lowering the temperature and said showering the vapor will be illustrated later as auxiliary embodiments.

Although in the previous paragraph only "a" micro device 210 is mentioned, "multiple" micro devices 210 may be used in practical applications and is still within the scope of the present disclosure, and will not be emphasized in the disclosure.

In some embodiments, the contact pad 242 is conductive. In some embodiments, the contact pad 242 includes one of copper and copper-rich material. The copper-rich material is a material with copper accounts for more than half of a number of atoms therein. In some embodiments, the contact pad 242 includes a bonding material. The bonding material includes titanium (Ti), tin (Sn), indium (In), or a combination thereof. One of Ti, Sn, and In accounts for more than half of a number of atoms of the bonding material. In some embodiments, a lateral length L of the micro device 210 is less than or equal to about 100 μm. In some embodiments, a lateral length L of the micro device 210 is less than or equal to about 100 μm.

Reference is made to FIGS. 2A and 2A'. In some embodiments, the micro device 210 is gripped by the transfer plate 230 via a mechanical force (e.g., an adhesive force) or an electromagnetic force (e.g., an electrostatic force or an enhanced electrostatic force generated by an alternating voltage through bipolar electrodes), but should not be limited thereto.

Reference is made to FIG. 2B. In some auxiliary embodiments, after moving the combination of the transfer plate 230 with the micro device 210 thereon and the receiving substrate 240 into the confined space 250, the method 100 further includes lowering a temperature of the combination of the transfer plate 230 with the micro device 210 thereon and the receiving substrate 240 in the confined space 250 including a vapor such that at least a portion of the vapor is condensed to form the water 220 on the micro device 210, on the contact pad 242, or on both the micro device 210 and the contact pad 242. Since the stage illustrated by FIG. 2B is performed within the confined space 250 in which the humidity therein is locally controlled, the degrees of lowering the temperature can be smaller compared to that without the confined space 250. Furthermore, it can form the water 220 more uniform which is not influenced by temperature gradient since the water 220 is formed by the relative humidity which is high enough. Although the water 220 is discontinuously distributed (e.g., island-like) on the micro device 210 or on the contact pad 242, the water 220 can also be continuously distributed and covering the receiving substrate 240 and the contact pad 242, or continuously distributed and covering the micro device 210 and the transfer plate 230. In some embodiments, the water 220 is formed at a temperature about the dew point. In some embodiments, one of a surface of the micro device 210 facing the contact pad 242 and a surface of the contact pad 242 facing the micro device 210 is hydrophilic, so as to make it tend to gather the water 220 on the micro device 210 and/or the contact pad 242 to assist attaching and binding the micro device 210 to the contact pad 242. The hydrophilic herein means a contact angle for one of the surface of the micro device 210 and the surface of the contact pad 242 as mentioned is smaller than 90 degrees.

After the water 220 is in contact with both the contact pad 242 and the micro device 210, the micro device 210 and the contact pad 242 are gripped together by a capillary force produced by two opposite surfaces of the water 220. In some embodiments, a thickness of the water 220 between the micro device 210 and the contact pad 242 is smaller than a thickness of the micro device 210, such that a relative position between the micro device 210 and the contact pad 242 after the water 220 is evaporated can be more accurately controlled (maintained). It is noted that the stage of aligning the transfer plate 230 (with the micro device 210 thereon) with the receiving substrate 240 (having the contact pad 242 thereon) as illustrated by FIG. 2A which is without contacting the micro device 210 with the contact pad 242 (i.e., not the embodiments illustrated by FIG. 2A') and the stage of moving the combination of the transfer plate 230 and the receiving substrate 240 into a confined space 250 can be exchanged and are still not depart from the scope of the present disclosure.

Reference is made to FIG. 2C. In some embodiments, attaching the micro device 210 to the contact pad 242 includes increasing a temperature within the confined space 250 such that the water 220 is evaporated and the micro device 210 is stuck to, bound to, and in contact with the contact pad 242. In some embodiments, the temperature within the confined space 250 is increased to a temperature point such that the relative humidity is smaller than about 80%. In some embodiments, the water 220 is evaporated with a temperature about a boiling point of the water 220.

Reference is made to FIG. 2C'. In some embodiments, attaching the micro device 210 to the contact pad 242 includes moving the combination of the transfer plate 230 with the micro device 210 thereon and the receiving substrate 240 out of the confined space 250 to an environment with a relative humidity smaller than about 80% such that the water 220 is evaporated and the micro device 210 is stuck to, bound to, and in contact with the contact pad 242.

Figure 3:
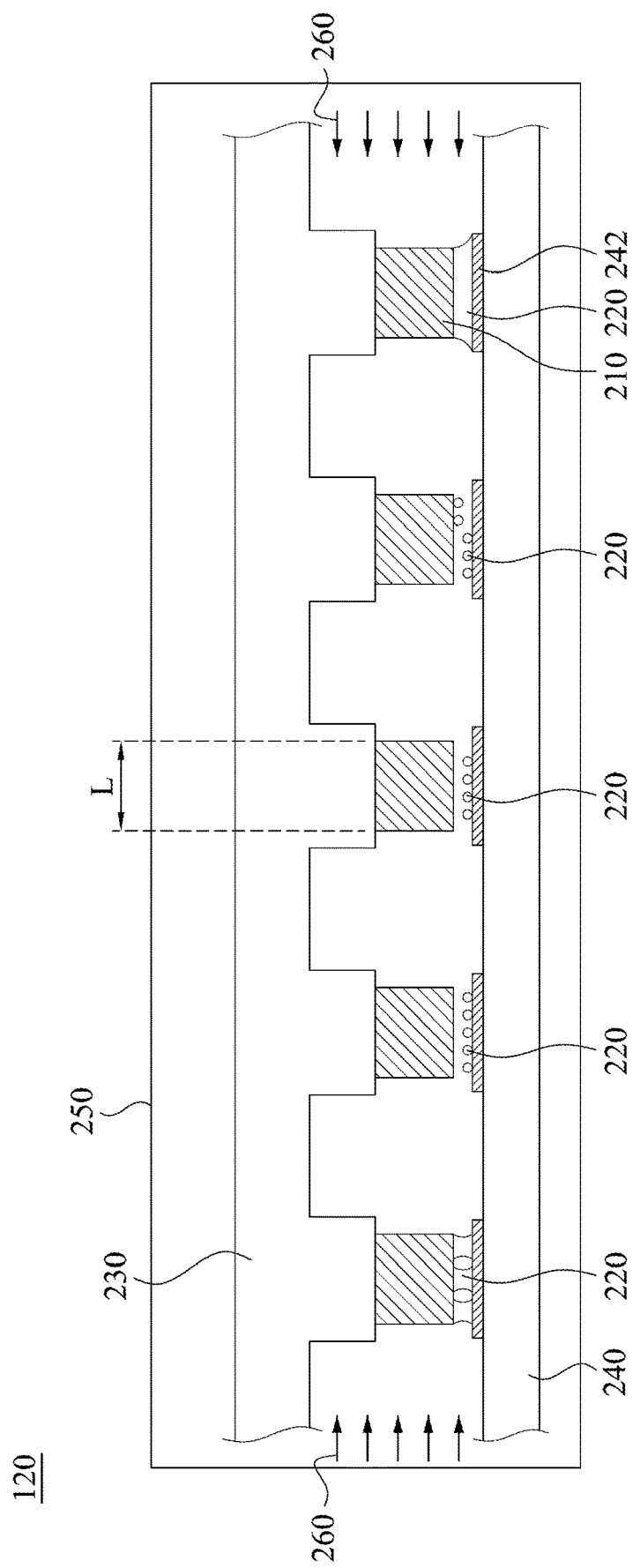
FIG. 3 is a schematic cross-sectional view of an optional intermediate stage of the method illustrated by FIG. 1 according to some embodiments of the present disclosure.

Reference is made to FIG. 3. FIG. 3 is a schematic cross-sectional view of an optional intermediate stage of the method 100 according to some embodiments of the present disclosure. In some auxiliary embodiments, after moving the combination of the transfer plate 230 with the micro device 210 thereon and the receiving substrate 240 into the confined space 250, the method 100 further includes showering a vapor 260 on the combination of the transfer plate 230 with the micro device 210 thereon and the receiving substrate 240 such that at least a portion of the vapor 260 is condensed to form the water 220. In some embodiments, the vapor 260 has a water vapor pressure higher than a water vapor pressure within the confined space 250. The water 220 is also allowed to be formed on the transfer plate 230, the receiving substrate 240, or on both the transfer plate 230 and the receiving substrate 240 in some embodiments. With the above conditions, the vapor 260 is more likely to condense on the micro device 210 and/or the contact pad 242 when the showering is performed. In some embodiments, the vapor 260 consists essentially of nitrogen and water. Since the stage illustrated by FIG. 3 is performed within the confined space 250 in which the humidity therein is locally controlled, the water 220 formed after said showering can maintain longer in the confined space 250 without being evaporated compared to that without the confined space 250.

Figure 4:
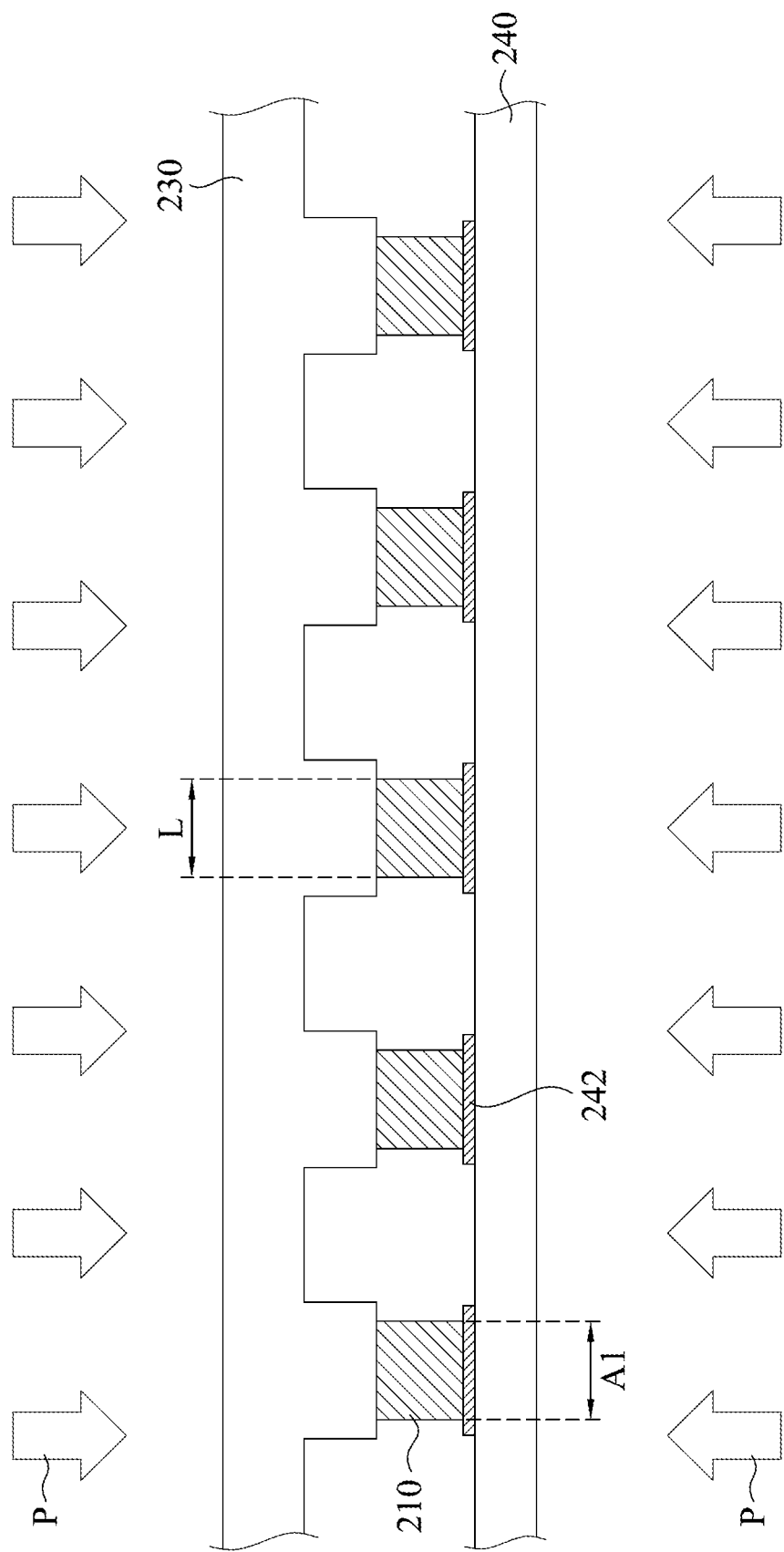
FIG. 4 is a schematic cross-sectional view of an optional intermediate stage of the method illustrated by FIG. 1 according to some embodiments of the present disclosure.

Reference is made to FIG. 4. FIG. 4 is a schematic cross-sectional view of an optional intermediate stage of the method 100 according to some embodiments of the present disclosure. In some embodiments, attaching the micro device 210 to the contact pad 242 further includes applying an external pressure P to press the micro device 210 and the contact pad 242 during evaporating the water 220 to further assist contacting the micro device 210 to the contact pad 242 for a better solid phase bonding therebetween to occur. The external pressure P can be produced and applied on the micro device 210 by pressing the transfer plate 230 toward the micro device 210 (e.g., placing an object on the transfer plate 230). In some embodiments, the object is an additional plate with a size (e.g., an area) equal to or greater than a size (e.g., an area) of the transfer plate 230. The additional plate as mentioned can produce a more uniform external pressure P on the micro device 210 compared to the object with random shapes and sizes.

Figure 5:
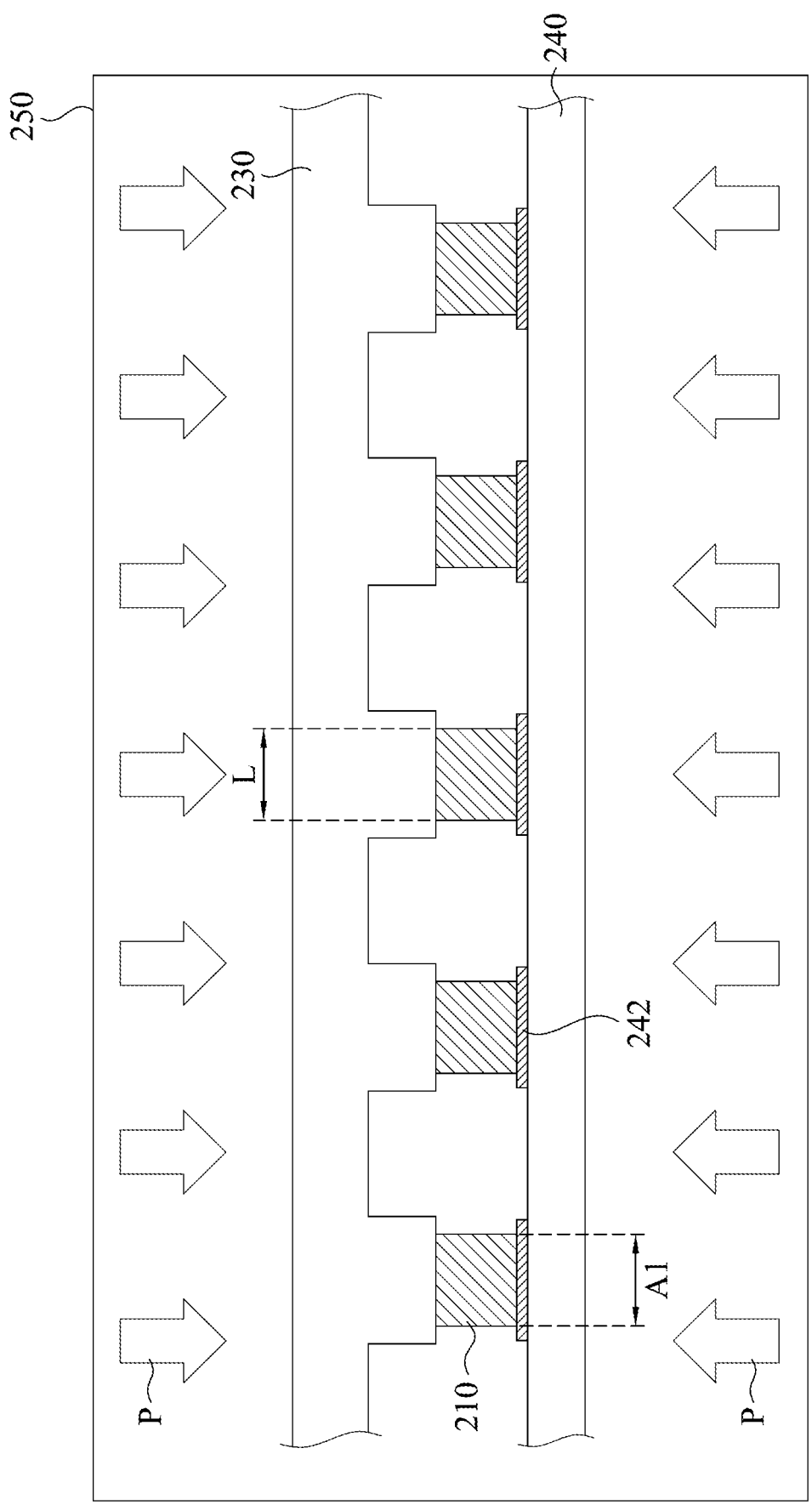
FIG. 5 is a schematic cross-sectional view of an optional intermediate stage of the method illustrated by FIG. 1 according to some embodiments of the present disclosure.

Reference is made to FIGS. 4 and 5. FIG. 5 is a schematic cross-sectional view of an optional intermediate stage of the method 100 according to some embodiments of the present disclosure. In some embodiments, the external pressure P can be applied by changing the pressure within the confined space 250 to press the micro device 210 and the contact pad 242, but should not be limited thereto.

Figure 6:
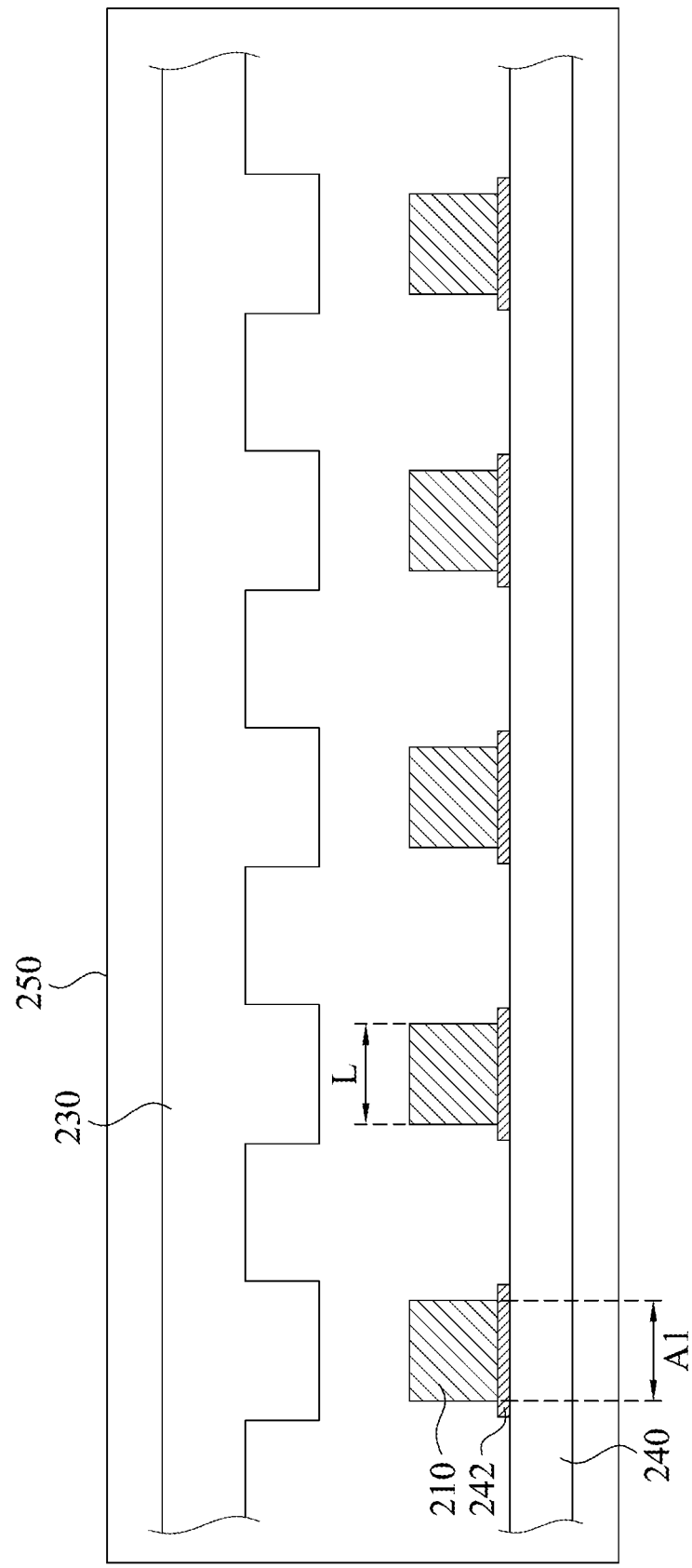
FIG. 6 is a schematic cross-sectional view of an optional stage of the method of transferring the micro device according to some embodiments of the present disclosure.

Reference is made to FIGS. 6 and 6'. FIG. 6 is a schematic cross-sectional view of an optional stage of the method 100 of transferring the micro device 210 according to some embodiments of the present disclosure. FIG. 6' is a schematic cross-sectional view of an optional stage of the method 100 of transferring the micro device 210 according to some embodiments of the present disclosure. In some embodiments, the micro device 210 is detached from the transfer plate 230 and the micro device 210 is stuck to the contact pad 242 of receiving substrate 240. Specifically, the transfer plate 230 is moved away from the receiving substrate 240 and the micro device 210 is detached from the transfer plate 230 and is stuck to the receiving substrate 240. The transfer plate 230 can be moved away from the receiving substrate 240 before or after the water 220 is evaporated (see in combination with FIGS. 2B and 2C as mentioned). It is noted that although the water 220 is not explicitly shown in FIG. 2C, there may be a tiny amount of water 220 between the micro device 210 and the contact pad 242. In most of the embodiments, the tiny amount of the water 220 is enough to attach the micro device 210 to the contact pad 242. The optional stage as illustrated by FIG. 6 is performed within the confined space 250, and the optional stage as illustrated by FIG. 6' is performed out of the confined space 250. In some embodiments, the temperature of the receiving substrate 240 is lowered down such that the water 220 is frozen before the micro device 210 is detached from the transfer plate 230. The frozen water 220 provides a force to grip the micro device 210, and the transfer plate 230 is then detached from the micro device 210.

Figure 7:
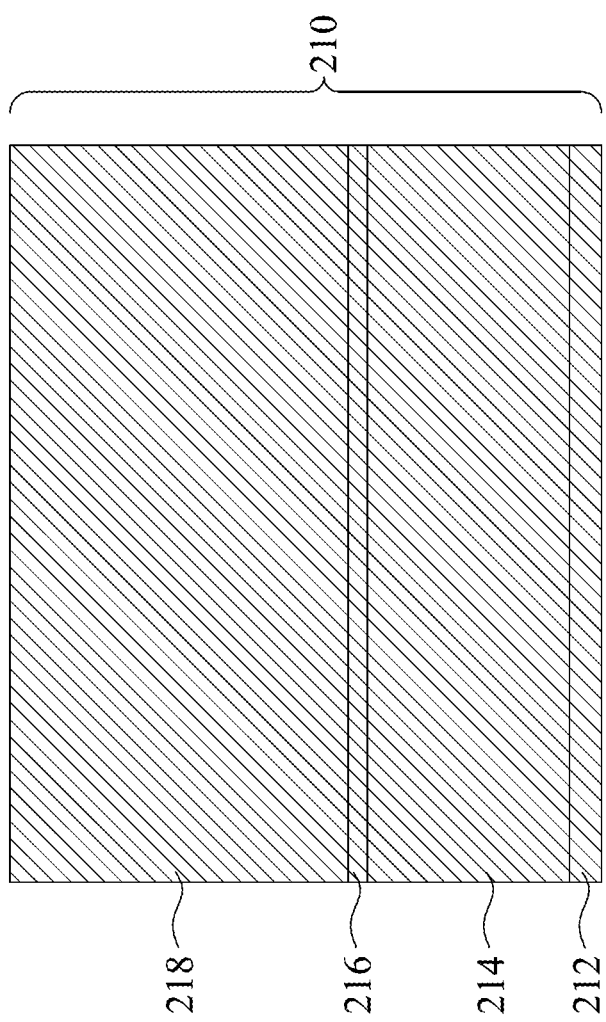
FIG. 7 is a schematic cross-sectional view of the micro device according to some embodiments of the present disclosure.

Reference is made to FIG. 7. FIG. 7 is a schematic cross-sectional view of the micro device 210 according to some embodiments of the present disclosure. In some embodiments, the micro device 210 includes an electrode 212 thereon, and the micro device 210 is bound to and in contact with the contact pad 242 via the electrode 212 after the water 220 is evaporated. In some embodiments, the micro device 210 includes a first type semiconductor layer 214, an active layer 216 on the first type semiconductor layer 214, and a second type semiconductor layer 218 on the active layer 216. The first type semiconductor layer 214 can be a p-type semiconductor layer, and the second type semiconductor layer 218 can be an n-type semiconductor layer, but should not be limited thereto.

In some embodiments, the combination of the micro device 210 and the receiving substrate 240 is further heated to produce a bonding force to bond the micro device 210 and the contact pad 242 together after evaporating the water 220 and before detaching the micro device 210 from the transfer plate 230. Since the bonding force is normally stronger than the water 220 assisted binding (force) as mentioned, the micro device 210 can be stuck to the contact pad 242 more firmly. In some embodiments, a temperature of the contact pad 242 is further increased to be above a boiling point of the water 220 and below a eutectic point between the contact pad 242 and the electrode 212 after evaporating the water 220. Specifically, said "below" means a temperature point is below the eutectic point but is enough to induce a solid phase diffusion between the contact pad 242 and the electrode 212 such that the micro device 210 is "bonded" to the contact pad 242 to strengthen the solidity between the electrode 212 and the contact pad 242. In such embodiments, the micro device 210 can be better protected (i.e., free from damage during the bonding process) due to a lower temperature bonding process.

In some embodiments, the temperature of the contact pad 242 is further increased to be above a eutectic point between the contact pad 242 and the electrode 212 after evaporating the water 220. In some embodiments, the temperature of the contact pad 242 is increased to a temperature point such that an solid phase diffusion occurs to bond the electrode 212 to the contact pad 242. In some embodiments, a thickness of the electrode 212 ranges from about 0.2 μm to about 2 μm to satisfy a balance between the criterion for the solid phase diffusion to occur and a trend to decrease a size of the micro device 210. In some embodiments, the electrode 212 includes a bonding material. The bonding material includes one of tin, indium, titanium, and a combination thereof. One of tin, indium, and titanium accounts for more than half of a number of atoms of the bonding material. In some embodiments, the electrode 212 includes one of copper and copper-rich material. The copper-rich material is a material with copper accounts for more than half of a number of atoms therein.

Reference is made back to 2C to 6'. In some embodiments, a contact area A1 between the electrode 212 and the contact pad 242 is smaller than or equal to about 1 square millimeter (mm$^2$). The limitation of the size of the contact area A1 as mentioned is to support the capillary force to pull a surface of the electrode 212 facing the contact pad 242 and a surface of the contact pad 242 facing the electrode 212 together and to assist the formation of the solid phase bonding after the water 220 is evaporated. If the contact area A1 is too large, an influence of the capillary force will be too small to pull the surface of the electrode 212 and the surface of the contact pad 242 together to an extent enough to assist the formation of the solid phase bonding after the water 220 is evaporated.

The structural integrity (solidity) between the electrode 212 and the contact pad 242 after the binding is strong enough to hold the micro device 210 in position and form the contact between the electrode 212 and the contact pad 242. It is also noted that "the water 220 assisted bonding" is preferably effective when the lateral length L of the micro device 210 is smaller than or equal to about 100 μm since a smaller lateral length L of the micro device 210 results in a higher ratio between a length of a periphery of a contact region and an area of the contact region (i.e., the contact area A1), which facilitates the influence of the capillary force and thus the formation of binding. Given the foregoing explanation, in some auxiliary embodiments, the electrode 212 is a patterned electrode including at least two isolated portions isolated from one another, so as to increase the ratio between the length of a periphery of a contact region and the area of the contact region.

In summary, embodiments of the present disclosure provide a method of transferring a micro device in which a confined space with a relative humidity greater than or equal to about 85% is adopted. As such, energy consumption is reduced, the formation of water used for assisting binding the micro device to a contact pad of a receiving substrate is not influenced by temperature gradient, and the water formed during the method can maintain longer, so as to broaden windows of many processing parameters and making operations easier.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of transferring a micro device, comprising:
   aligning a transfer plate with the micro device thereon with a receiving substrate having a contact pad thereon such that the micro device is above or in contact with the contact pad;
   moving a combination of the transfer plate with the micro device thereon and the receiving substrate into a confined space with a relative humidity greater than or equal to about 85%;
   showering a vapor on the combination or lowering a temperature of the combination in the confined space comprising a vapor such that at least a portion of the vapor is condensed to form water on one of the micro device and the contact pad after moving the combination of the transfer plate with the micro device thereon and the receiving substrate into the confined space; and
   attaching the micro device to the contact pad.

2. The method of claim 1, wherein attaching the micro device to the contact pad comprises:
   moving the combination out of the confined space to an environment with a relative humidity smaller than about 80% such that the water is evaporated and the micro device is stuck to and in contact with the contact pad.

3. The method of claim 2, wherein attaching the micro device to the contact pad further comprises:
   applying an external pressure to press the micro device and the contact pad during evaporating the water.

4. The method of claim 1, wherein attaching the micro device to the contact pad comprises:
   increasing a temperature within the confined space such that the water is evaporated and the micro device is stuck to and in contact with the contact pad.

5. The method of claim 4, wherein the temperature within the confined space is increased to a temperature point such that the relative humidity is smaller than about 80%.

6. The method of claim 4, wherein attaching the micro device to the contact pad further comprises:
   applying an external pressure to press the micro device and the contact pad during evaporating the water.

7. The method of claim 1, wherein attaching the micro device to the contact pad comprises:
   applying an external pressure to press the micro device and the contact pad.

8. The method of claim 1, wherein one of a surface of the micro device facing the contact pad and a surface of the contact pad facing the micro device is hydrophilic.

9. The method of claim 1, wherein the confined space is constructed by a chamber.

10. The method of claim 1, wherein the vapor has a water vapor pressure higher than a water vapor pressure within the confined space.

11. The method of claim 1, wherein the vapor consists essentially of nitrogen and water.

* * * * *